United States Patent [19]

Yang et al.

[11] Patent Number: 6,057,210
[45] Date of Patent: *May 2, 2000

[54] METHOD OF MAKING A SHALLOW TRENCH ISOLATION FOR ULSI FORMATION VIA IN-DIRECT CMP PROCESS

[75] Inventors: Fu-Liang Yang, Tainan; Wei-Ray Lin, Yi Lan; Ming-Hong Kuo, Pintung, all of Taiwan

[73] Assignee: Vanguard International Semiconductor Corporation, Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/063,956

[22] Filed: Apr. 21, 1998

[51] Int. Cl.[7] .................................................. H01L 21/76
[52] U.S. Cl. ........................ 438/427; 438/424; 438/435; 438/437; 148/DIG. 50
[58] Field of Search .................................... 438/424, 427, 438/433, 435, 437; 148/DIG. 50

[56] References Cited

U.S. PATENT DOCUMENTS

| 5,721,173 | 2/1998 | Yano et al. | 438/424 |
| 5,728,621 | 3/1998 | Zheng et al. | 438/427 |
| 5,851,899 | 12/1998 | Weigand | 438/427 |
| 5,880,007 | 3/1999 | Varian et al. | 438/424 |

OTHER PUBLICATIONS

Chatterjee, A. et al., "Intergration of unit proceses in a shallow trench isolation module for a 0.25 μm complementary metal–oxide semiconductor technology," *J. Vac. Sci.Technol. B. 15(6)*, Nov./Dec. 1997, pp. 1936–1942.

*Primary Examiner*—Trung Dang
*Attorney, Agent, or Firm*—Christensen O'Connor Johnson & Kindness PLLC

[57] ABSTRACT

A silicon dioxide layer and a silicon nitride layer are formed on the wafer. Subsequently, a plurality of shallow trenches are generated in the wafer. A HDP-CVD oxide having protruding portions is refilled into the trenches and formed on the silicon nitride layer for isolation. A wet etch is performed to etch the HDP-CVD oxide layer such that the corners of the silicon nitride layer formed on the active area will be exposed. A cap silicon nitride layer is then conformally formed on the surface of the oxide layer. Then, a chemical mechanical polishing (CMP) process is used to remove the top of the cap silicon nitride layer, thereby exposing the residual protruding portions of the oxide layer. The residual protruding portions of the oxide layer are next removed. Then, the silicon nitride layer and the cap silicon nitride layer are both removed by conventional methods. Finally, the pad oxide is removed.

20 Claims, 4 Drawing Sheets

METHOD OF MAKING A SHALLOW TRENCH ISOLATION FOR ULSI FORMATION VIA IN-DIRECT CMP PROCESS

FIELD OF THE INVENTION

The present invention relates generally to semiconductor processing, and more specifically, to a method for forming a shallow trench isolation by using a HDP-CVD (high density plasma-chemical vapor deposition) oxide technique.

BACKGROUND OF THE INVENTION

The formation of semiconductor devices involves the fabrication of isolation structures that provides isolation between individual semiconductor devices. Thus, in order to fabricate effective integrated circuits (ICs), isolation devices must first be formed in the silicon substrate. Ineffective isolation will cause leakage currents. Even a small amount of leakage in a device can induce significant power dissipation for the overall circuit in ultra large scale integrated circuits (ULSI). Several different isolation technologies have been proposed, including LOCOS (LOCal Oxidation of Silicon), shallow trench isolation (STI), LOCOS-based isolation such as poly-buffered LOCOS (PBL), and framed-mask PBL technologies.

The most widely used method for forming isolation regions is LOCOS. As device geometry has shrunk to the sub-half micron order, conventional LOCOS isolation cannot meet the requirements of ULSI fabrication. The major drawback of LOCOS is the "bird's beak" effect. In this effect, the oxidant laterally diffuses at the edges of the silicon nitride during the formation of the isolation. Oxide forms under the nitride edges and lifts the nitride edges. This lateral extension of the field oxide causes unacceptably large encroachment on the field oxide into the device active regions. Further, the planarity of the surface topography is inadequate for sub-micron lithography needs.

Trench isolation is used primarily for isolating devices in VLSI and ULSI, and hence it can be considered as a replacement for conventional LOCOS isolation. Further, shallow trench isolation is gaining popularity for quarter-micron technology. In the basic shallow trench isolation (STI) technology, shallow trenches are anisotropically etched into the silicon substrate. Next, a CVD oxide is deposited onto the substrate and is then planarized by CMP (Chemical Mechanical Polishing) or etching back.

Unfortunately, the planarization of shallow trench isolation relies on chemical mechanical polishing (CMP) which has proven an effective but challenging process. For example, one of the issues associated with CMP for STI is the dishing effect for wide trenches. :The dishing effect makes it difficult to obtain a planar surface. In addition, it also impacts the control of subsequent processes, such as lithography and ion implantation.

One prior art approach to this issue is the use of a dummy pattern. Although the use of this conventional method can improve the result of CMP planarization, it is a complicated task that involves the additional steps of lithography and etching. Further, the CMP also exhibits the characteristics of bad uniformity over the entire wafer, pattern-dependent polishing uniformity and instability of polishing rate.

SUMMARY OF THE INVENTION

A method is disclosed to fabricate a shallow trench isolation (STI) by using HDP-CVD (high density plasma-chemical vapor deposition) oxide technique. Further, the present invention forms the isolation by using an in-direct chemical mechanical polishing (CMP) process. In other words, the gap filling material is not directly planarized by the CMP. A thin silicon dioxide layer is formed on the wafer to act as a pad layer. Subsequently, a silicon nitride layer is deposited on the pad layer to serve as a stop layer. A plurality of shallow trenches are generated in the wafer. A HDP-CVD oxide having protruding portions is refilled into the trenches and formed on the silicon nitride layer for isolation. The protruding portions are aligned to the area not used to form the trenches. A selective wet etching is performed to etch the HDP-CVD oxide layer such that the corners of the silicon nitride layer formed on the active area will be exposed. If the corners are already exposed while the HDP-CVD oxide layer is formed, then this etching step can be omitted. A cap silicon nitride layer is conformally formed on the surface of the oxide layer. Then, a chemical mechanical polishing (CMP) process is used to remove the top of the cap silicon nitride layer, thereby exposing the residual protruding portions of the oxide layer. The residual protruding portions of the oxide layer are removed. Then, the silicon nitride layer and the cap silicon nitride layer are both removed by conventional methods. Lastly, the pad oxide is removed by HF or BOE solution.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclose to fabricate a shallow trench isolation (STI) by using a HDP-CVD (high density plasma-chemical vapor deposition) oxide technique. Further, the present invention forms the isolation by using an in-direct chemical mechanical polishing (CMP) process. The method also utilizes the HDP-CVD (high density plasma-chemical vapor deposition) technique to form the oxide, which is referred to as HDP-CVD oxide. The oxide formed by the aforesaid method exhibits excellent void-free gap filling characteristics. It also features the advantage of self-planarization. One similar technique is proposed by J. T. Pye, et al,. in Solid State Technology, p.65, December, 1995. It can be understood as a simple combination of two simultaneous processes: deposition and etching. The deposition process primarily depends on ion-induced and redeposition components. The profile of the HDP-CVD oxide has protruding portions formed thereon and aligned to the underlying pattern. The present invention not only solves the dishing problem but also eliminates the problems that are related to planarization of CMP. As will be seen below, this technique can be used for manufacturing the shallow trench isolation.

Figure 1:
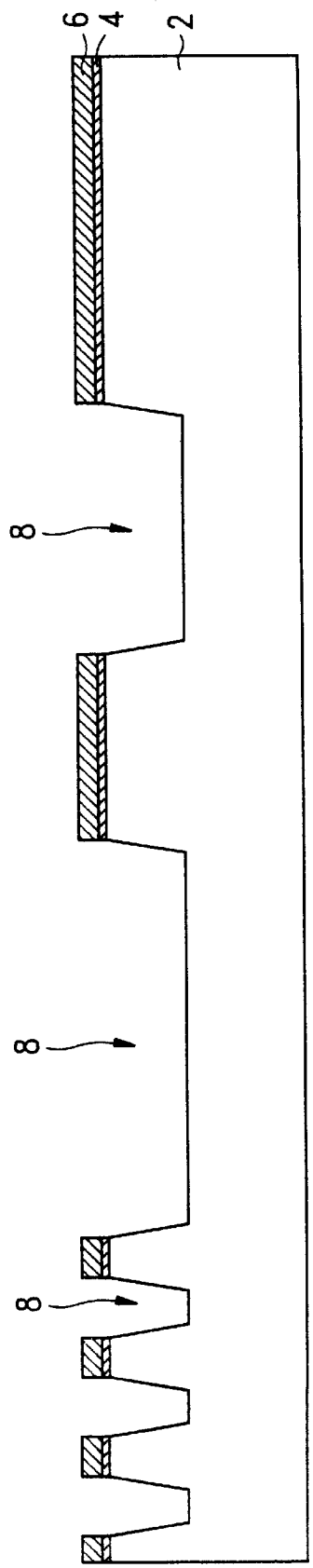
FIG. 1 is a cross section view of a semiconductor wafer illustrating the step of forming trenches in the wafer in accordance with the present invention.

Referring to FIG. 1, in the preferred embodiment, a semiconductor wafer, such as a silicon wafer 2 with <100> crystallographic orientation is provided. A thin silicon dioxide layer 4 is formed on the wafer 2 to act as a pad layer. The silicon dioxide 4 is typically formed by using a thermal oxidation in an oxygen ambient. For example, the silicon dioxide layer 4 is formed by using an oxygen-steam ambient, at a temperature of about 800–1100° C. Alternatively, the oxide layer 4 may be formed using any suitable chemical vapor deposition. In this case, the thickness of the silicon dioxide layer is approximately 50–500 angstroms.

Subsequently, a silicon nitride layer 6 is deposited on the pad layer 4 to serve as a stop layer. The silicon nitride layer 6 can be deposited by any suitable process. The thickness of the silicon nitride layer is about 500 to 2000 angstroms. Further, the temperature used in forming the silicon nitride layer 6 is at a range of 500 to 1000 degrees centigrade. In the preferred embodiment, the reaction gases used to form the silicon nitride layer 6 are selected from $SiH_4$, $NH_3$, $N_2$, $N_2O$ or $SiH_2Cl_2$, $NH_3$, $N_2$, $N_2O$.

Still referring to FIG. 1, a photoresist (not shown) is patterned on the silicon nitride layer 6 to define the isolation regions. A plurality of shallow trenches 8 are subsequently generated by a dry etching technique. The trenches have differing width of openings. The silicon nitride layer 6, the pad layer 4 and the silicon wafer 2 can be etched away by conventional techniques. Typically, the depth of the shallow trench is about 2000 to 10000 angstroms from the surface of the silicon nitride layer 6. The photoresist is then stripped away after the trenches 8 are formed.

Figure 2:
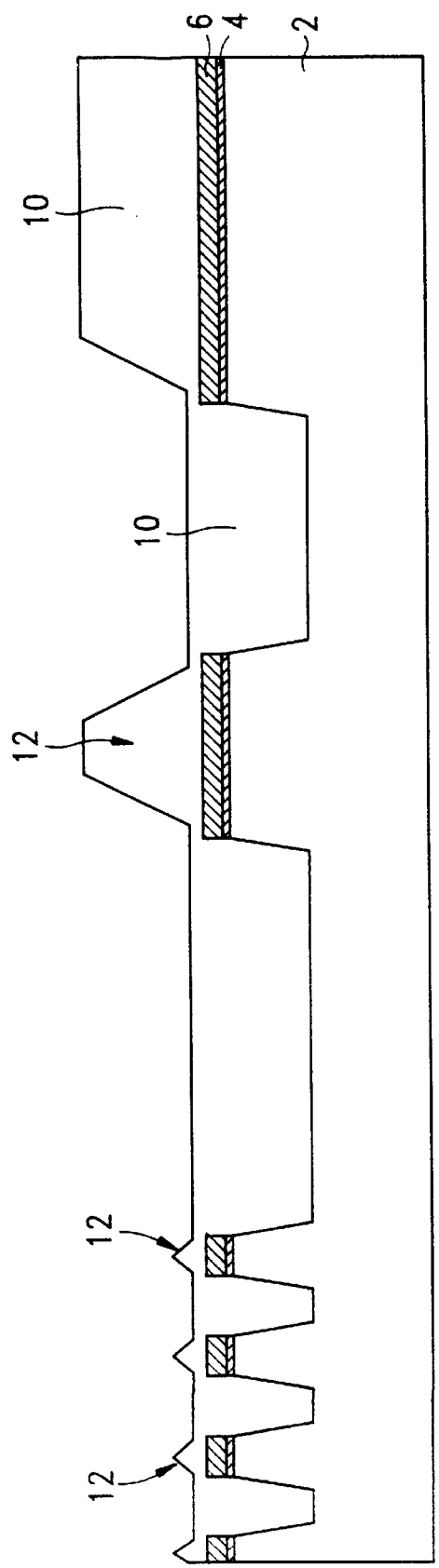
FIG. 2 is a cross section view of a semiconductor wafer illustrating the step of forming an oxide in accordance with the present invention.

Turning next to FIG. 2, an HDP-CVD oxide layer 10 is refilled into the trenches 8 and formed on the silicon nitride layer 6 for isolation. The HDP-CVD oxide 10 can be formed by ECR (electron cyclotron resonance), helicon, or ICP (inductively coupled plasma) methods. The deposition of the HDP-CVD oxide 10 is non-conformal due to the fact that for HDP-CVD, side wall deposition is much slower than planar deposition. Thus, the oxide layer 10 formed by the method has protruding portions 12 aligned to the area not used to form the trenches 8. Preferably, the oxide layer 10 is formed at a temperature in the range of about 300 to 900 degrees centigrade.

Figure 3:
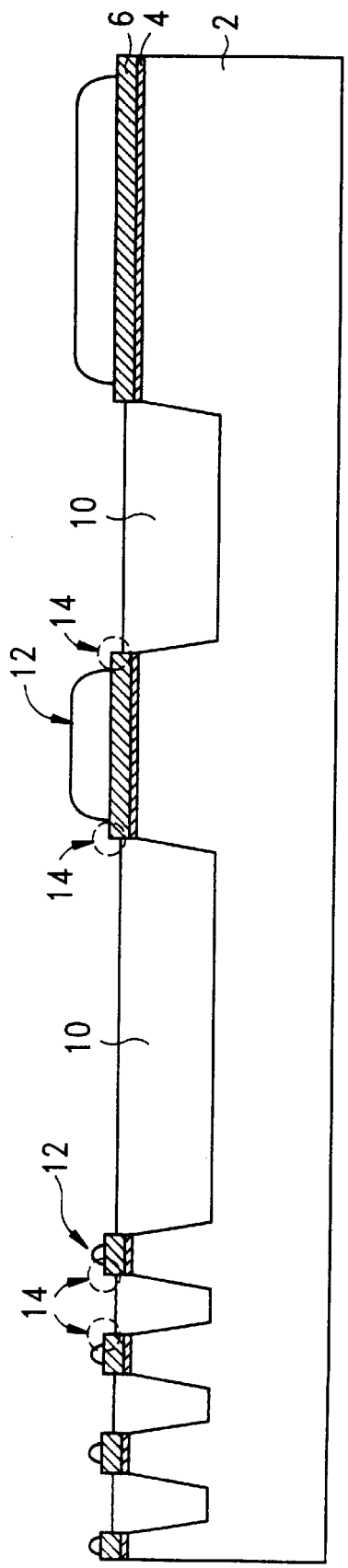
FIG. 3 is a cross section view of a semiconductor wafer illustrating the step of exposing corners of a first silicon nitride layer in accordance with the present invention.

Referring next to FIG. 3, a selective wet etching is performed to etch the HDP-CVD oxide layer 10 such that the corners 14 of the silicon nitride layer 6 formed on the active area will be exposed. This is the key step of the present invention. If the corners 14 are already exposed while the HDP-CVD oxide layer 10 is formed, then this etching step can be omitted. The exposed corners 14 are very important. The exposed corners 14 ensures that the silicon nitride corners 14 are in direct contact to a further deposited layer of cap nitride. This ensures that the filled oxide can be fully enclosed in the trenches 8. The final structure can be seen in FIG. 3, with residual protruding portions 14 separating the residual oxide 12 from the main HDP-CVD oxide layer 10 in the trenches 8.

Figure 4:
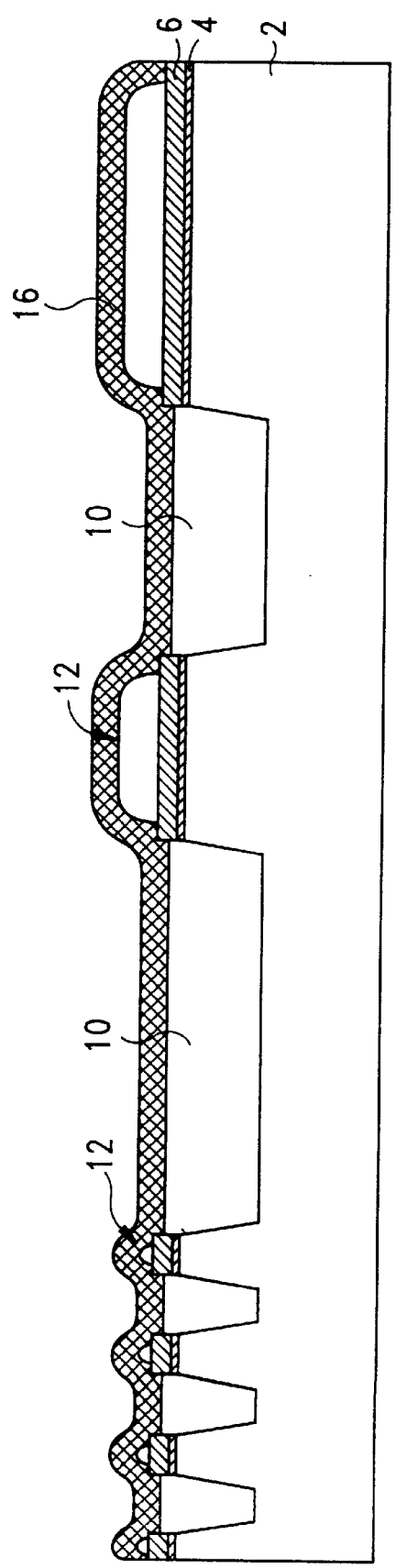
FIG. 4 is a cross section view of a semiconductor wafer illustrating the step of forming a second silicon nitride layer on the oxide layer in accordance with the present invention.

Turning to FIG. 4, a cap silicon nitride layer 16 is conformally formed by chemical vapor deposition on the surface of the oxide layer 10 to a thickness of about 500 to 1500 angstroms. As with the prior art, it can be formed by using reaction gases containing $SiH_4$, $NH_3$, $N_2$, $N_2O$ or $SiH_2Cl_2$, $NH_3$, $N_2$, $N_2O$.

Figure 5:
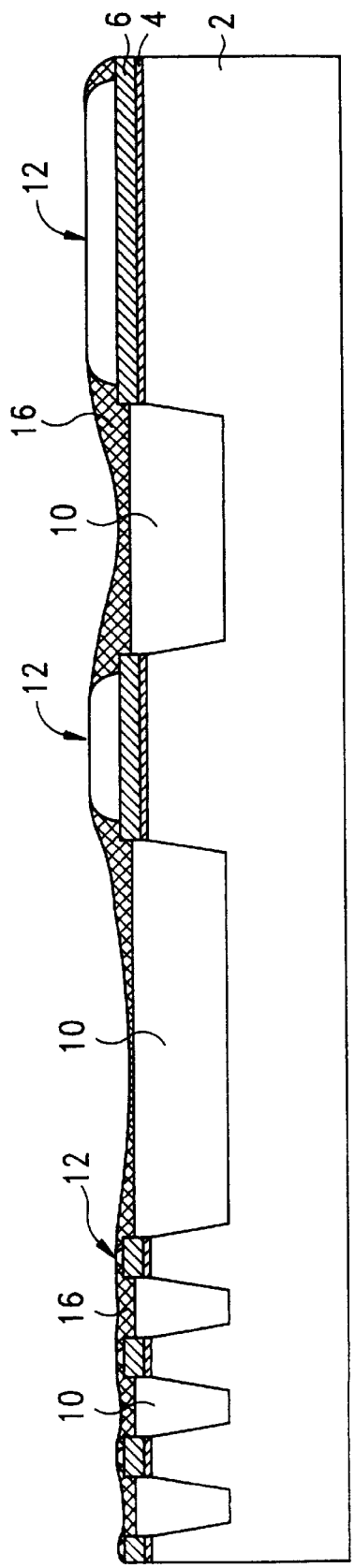
FIG. 5 is a cross section view of a semiconductor wafer illustrating the step of performing a chemical mechanical polishing to polish the second silicon nitride layer in accordance with the present invention.

Referring to FIG. 5, a chemical mechanical polishing (CMP) step is used to remove the top of the cap silicon nitride layer 16, thereby exposing the residual protruding portions 12 of the oxide layer 10 formed on the active area.

Figure 6:
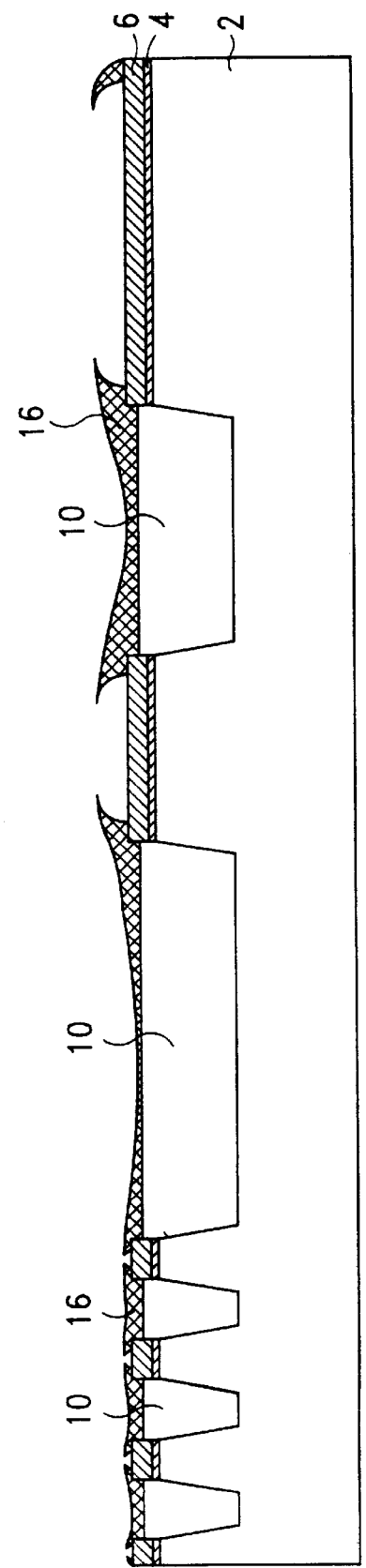
FIG. 6 is a cross section view of a semiconductor wafer illustrating the step of removing the protruding portions of the oxide layer in accordance with the present invention.

Turning next to FIG. 6, the residual protruding portions 12 of the oxide layer 10 are removed. Preferably, the oxide can be stripped by using a HF solution or a BOE (buffer oxide etching) solution. If the oxide in the trenches 8 and the protruding portions 12 are not separated by the corners 14 of the silicon nitride layer 8 by above step, the oxide 10 in the trenches 8 will be attack during the wet etching.

Figure 7:
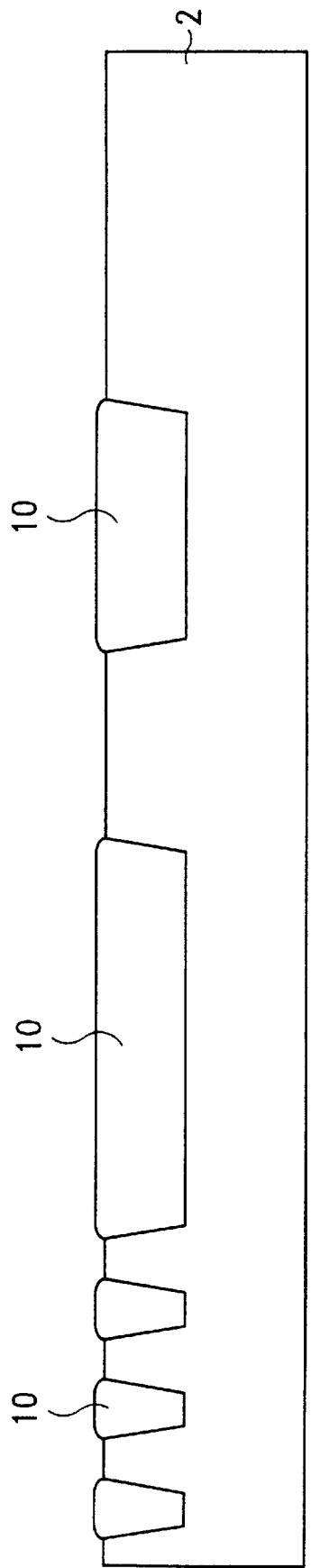
FIG. 7 is a cross section view of a semiconductor wafer illustrating the step of removing the first and second silicon nitride layers in accordance with the present invention.

Finally, referring to FIG. 7, the silicon nitride layer 6 and the cap silicon nitride layer 16 are both removed by conventional methods. For example, they can be removed by hot phosphorus acid solution. Then, the pad oxide 4 is also removed by HF or BOE solution.

The present invention provides a shallow trench isolation (STI) by using HDP-CVD (high density plasma-chemical vapor deposition) oxide technique and in-direct CMP to improve the resulting topography of the STI. Further, the problems that are generated by conventional methods will be eliminated by the present invention.

As is understood by a person skilled in the art, the foregoing preferred embodiment of the present invention is illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming trench isolations on a silicon wafer, said method comprising:

forming a pad layer on said silicon wafer;

forming a first silicon nitride layer on said pad layer;

forming trenches by etching said first silicon nitride layer, said pad layer and said silicon wafer;

forming an HDP-CVD oxide on said first silicon nitride layer and into said trenches, said oxide having protruding portions formed thereon and aligned to an active area of said wafer;

etching said HDP-CVD oxide to expose corners of said silicon nitride layer, thereby separating said HDP-CVD oxide into protruding portions on said active area and trench portions within said trenches;

forming a second silicon nitride layer on said oxide and said protruding portions;

exposing said residual protruding portions;

removing said residual protruding portions; and removing said first and said second silicon nitride layers.

2. The method of claim 1, wherein said residual protruding portions are exposed by using chemical mechanical polishing to remove said second silicon nitride layer.

3. The method of claim 1, wherein said HDP-CVD oxide is formed at a temperature of about 300–900 degrees centigrade.

4. The method of claim 1, wherein said corners of said first silicon nitride layer are exposed by using a HF solution.

5. The method of claim 1, wherein said corners of said first silicon nitride layer are exposed by using a BOE.

6. The method of claim 1, wherein said residual protruding portions are removed by using HF solution.

7. The method of claim 1, wherein said residual protruding portions are removed by using BOE solution.

8. The method of claim 1, wherein said first and said second silicon nitride layers are removed by a hot phosphorus acid solution.

9. The method of claim 1, wherein said pad oxide layer is removed by HF solution.

10. The method of claim 1, wherein said pad layer is removed by BOE solution.

11. A method of forming trench isolations on a silicon wafer, said method comprising:

forming a pad layer on said silicon wafer;

forming a first silicon nitride layer on said pad layer;

forming trenches by etching said first silicon nitride layer, said pad layer and said silicon wafer;

forming a HDP-CVD oxide on said first silicon nitride layer and into said trenches, said HDP-CVD oxide having protruding portions formed thereon and aligned to an active area of said wafer, said HDP-CVD oxide in said trenches being separated from said protruding portions by exposed corners of said first silicon nitride layer;

forming a second silicon nitride layer on said oxide and said protruding portions;

exposing said protruding portions;

removing said protruding portions;

removing said first and said second silicon nitride layers.

12. The method of claim 11, wherein said residual protruding portions are exposed by using chemical mechanical polishing to remove said second silicon nitride layer.

13. The method of claim 11, wherein said oxide is formed at a temperature of about 300–900 degrees centigrade.

14. The method of claim 11, wherein said corners of said first silicon nitride layer are exposed by using HF solution.

15. The method of claim 11, wherein said corners of said first silicon nitride layer are exposed by using BOE (buffer oxide solution).

16. The method of claim 11, wherein said residual protruding portions are removed by using HF solution.

17. The method of claim 11, wherein said residual protruding portions are removed by using BOE solution.

18. The method of claim 11, wherein said first and said second silicon nitride layer are removed by hot phosphorus acid solution.

19. The method of claim 11, wherein said pad oxide layer is removed by HF solution.

20. The method of claim 11, wherein said pad layer is removed by BOE solution.

* * * * *